United States Patent
Oda et al.

(10) Patent No.: US 6,476,550 B1
(45) Date of Patent: *Nov. 5, 2002

(54) ORGANIC ELECTROLUMINESCENT DEVICE WITH A DEFRACTION GRADING AND LUMINESCENT LAYER

(75) Inventors: Atsushi Oda, Tokyo (JP); Hitoshi Ishikawa, Tokyo (JP); Satoru Toguchi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,409

(22) Filed: Mar. 24, 1999

(30) Foreign Application Priority Data

Mar. 27, 1998 (JP) .............................. 10-081860

(51) Int. Cl.⁷ ................................. B32B 9/00
(52) U.S. Cl. ....................... 313/504; 313/503
(58) Field of Search .................. 313/504, 506, 313/509, 503; 349/89, 201; 359/51, 53, 94

(56) References Cited

U.S. PATENT DOCUMENTS 5,473,448 A * 12/1995 Yoshinaga et al. ............ 359/51
5,705,285 A * 1/1998 Shi et al. .................... 428/690
6,072,620 A * 1/2000 Shiono et al. ............... 359/290

FOREIGN PATENT DOCUMENTS

| JP | 62-172691 | 7/1987 |
| JP | 63-54184 | 4/1988 |
| JP | 63-314795 | 12/1988 |
| JP | 1-220394 | 9/1989 |
| JP | 3-133095 | 6/1991 |
| JP | 7-27913 | 1/1995 |
| JP | 7-506683 | 7/1995 |
| JP | 8-83688 | 3/1996 |
| JP | 9-115667 | 5/1997 |
| JP | 10-172756 | 6/1998 |
| JP | 10-270170 | 10/1998 |

OTHER PUBLICATIONS

C.W. Tang et al., "Organic Electroluminescent Diodes", pp. 913–915, Appl. Phys Letter, vol. 51, No. 12, Sep. 12, 1987.

* cited by examiner

Primary Examiner—Vip Patel
Assistant Examiner—Ken A Berck
(74) Attorney, Agent, or Firm—Young & Thompson

(57) ABSTRACT

This invention provides organic electroluminescent devices in which a diffraction grating is formed as a constituent element thereof on the reflecting surface of the cathode or on the light output side, resulting in an improvement in light output efficiency.

16 Claims, 4 Drawing Sheets

0.5μm  0.5μm

ORGANIC ELECTROLUMINESCENT DEVICE WITH A DEFRACTION GRADING AND LUMINESCENT LAYER

BACKGROUND OF THE INVENTION

1. Field of the Invention

This invention relates to organic electroluminescent devices having high luminous efficiency.

2. Description of the Prior Art

Organic electroluminescent devices are self-luminous devices based on the principle that, when an electric field is applied, a fluorescent material emits light owing to the energy of the recombination of positive holes injected from an anode and electrons injected from a cathode. Since low-voltage driven organic electroluminescent devices of the laminated structure type were reported by C. W. Tang et al. (e.g., C. W. Tang and S. A. VanSlyke, Applied Physics Letters, Vol. 51, p. 913, 1987), active investigations on organic electroluminescent devices using organic materials as components have been carried on. Tang et al. used tris(8-quinolinol)-aluminum for the luminescent layer and a triphenyldiamine derivative for the hole transport layer. Advantages of the laminated structure are such that the efficiency of the injection of positive holes into the luminescent layer can be enhanced, the efficiency of the formation of excitons by recombination can be enhanced by blocking electrons injecting from the cathode, and the excitons formed in the luminescent layer can be confined. As can be seen from these examples, the well-known structures of organic electroluminescent devices include, for example, a two-layer type consisting of a hole transport (or injection) layer and an electron-transporting luminescent layer, and a triple-layered type consisting of a hole transport (or injection) layer, a luminescent layer and an electron transport (or injection) layer. In these devices of the laminated structure type, various attempts have been made to modify the device structure or their fabrication method and thereby enhance the efficiency of the recombination of injected positive holes and electrons.

However, in organic electroluminescent devices, the probability of singlet formation during carrier recombination is limited owing to its dependence on spin statistics. Consequently, there is an upper limit to the probability of light emission. This upper limit is known to have a value of about 25%. Moreover, in organic electroluminescent devices, light having an exit angle greater than the critical angle undergoes total reflection owing to the influence of the refractive index of the luminescent material, and cannot be taken out of the device as shown in FIG. 1. Consequently, on the assumption that the luminescent material has a refractive index of 1.6, only 20% of the total light produced can be effectively utilized. When the probability of singlet formation is also taken into consideration, energy conversion efficiency is inevitably limited to as low as about 5% (Tetsuo Tsutsui, "Present State and Trend of Organic Electroluminescent", The Display Monthly, Vol. 1, No. 3, p. 11, September, 1995). In organic electroluminescent devices in which the probability of light emission is severely limited, low light output efficiency would cause a fatal reduction in efficiency.

The method of improving light output efficiency has conventionally been investigated in light-emitting devices having a similar structure, such as inorganic electroluminescent devices. For example, there have been proposed a method for enhancing efficiency by imparting light-condensing properties to the substrate (Japanese Patent Laid-Open No. 314795/'88) and a method for enhancing efficiency by forming reflecting surfaces on the sides or other parts of the device (Japanese Patent Laid-Open No. 220394/'89). These methods are effective for devices having a large light emission area. However, for devices having a minute picture element area, such as dot matrix displays, it is difficult to fabricate lenses for providing light-condensing properties or form lateral reflecting surfaces or the like. Moreover, since the luminescent layer of an organic electroluminescent device has a thickness of several micrometers or less, it is difficult to make the device tapered and form reflecting mirrors on the sides thereof according to current fine machining techniques. Even if it is possible, a considerable increase in cost will be caused. Furthermore, a method for forming an antireflection film by interposing a flat layer having an intermediate refractive index between the glass substrate and the luminescent layer is also known (Japanese Patent Laid-Open No. 172691/'87). This method is effective in improving light output efficiency in the forward direction, but cannot prevent total reflection. Consequently, this method is effective for inorganic electroluminescent devices having a high refractive index, but fails to produce a remarkable efficiency-improving effect on organic electroluminescent devices using a luminescent material having a relatively low refractive index.

Accordingly, the conventional light output method used for organic electroluminescent devices is still unsatisfactory, and the development of a new light output method is essential for the purpose of enhancing the efficiency of organic electroluminescent devices.

Japanese Patent Laid-open No. 83688/96 discloses an organic EL device having a light scattering part on an outside surface of the element. Japanese Patent Laid-open No. 115667/97 discloses an EL device having a light reflecting structure which reflects light from the light emitting surface. Japanese Utility-model Laid-open No. 54184/88 discloses an EL device having micro lens film on the EL element.

These three publications neither teach nor suggest the present organic EL device having a diffraction grating or zone plate as a constituent element.

SUMMARY OF THE INVENTION

An object of the present invention is to improve light output efficiency in organic electroluminescent devices and thereby provide organic electroluminescent devices having higher efficiency.

In order to accomplish the above objects, the present invention provides a EL device which has the following feature.

(1) In an organic electroluminescent device having one or more organic layers including a luminescent layer between an anode and a cathode, the device additionally includes a diffraction grating or zone plate as a constituent element.

In preferred embodiments, the present invention also has the following features.

(2) In the device described above in (1), the anode and the cathode form the same picture elements, one of these electrodes is an electrode reflecting visible light, and the diffraction grating or zone plate is formed in this reflecting electrode.

(3) In the device described above in (2), the device has a structure in which the diffraction grating or zone plate, the reflecting electrode, the organic layers and the transparent electrode are formed on a substrate in the order mentioned.

(4) In the device described above in (1), the anode and the cathode form the same picture elements, one of these electrodes is an electrode reflecting visible light, and the diffraction grating or zone plate is formed in the electrode opposite to the reflecting electrode.

(5) In the device described above in (4), the device has a structure in which the diffraction grating or zone plate, the transparent electrode, the organic layers and the reflecting electrode are formed on a transparent substrate in the order mentioned.

(6) In the device described above in (4) or (5), the diffraction grating or zone plate has no light-intercepting part.

(7) In the device described above in any of (1) to (6), the diffraction grating has a two-dimensional periodic configuration.

As described above, the present invention relates to an organic electroluminescent device having one or more organic thin-film layers including a luminescent layer between an anode and a cathode, the device additionally includes a diffraction grating or zone plate as a constituent element. This diffraction grating or zone plate may be either of the reflection type or the transmission type. In the case of a diffraction grating or zone plate of the transmission type, not only an amplitude grating formed by providing it with light-intercepting parts can be used, but also a phase grating formed by modulating the thickness of a layer having a different refractive index may be used to further enhance light output efficiency. Moreover, in the case of a diffraction grating, a grating having a two-dimensional periodic configuration may be used. Thus, as compared with a conventional diffraction grating consisting of a plurality of stripes, light output in a direction parallel to the stripes can be improved.

DETAILED DESCRIPTION OF THE INVENTION

First of all, the principle of the present invention is explained below.

In an organic electroluminescent device, the refractive index of the organic layer including the luminescent layer is higher than that of the substrate. material (e.g., glass), so that all of the light produced therein cannot be taken out owing to the occurrence of total reflection at the interface between the organic layer and the substrate. Even where the light is taken out from the side opposite to the substrate, total reflection also occurs at the interface between the device and air owing to the difference in refractive index between them. The principle of the present invention is that, in order to suppress such total reflection, a diffraction grating is formed in the substrate interface or the reflecting surface so as to alter the incidence angle of light with respect to the light output surface and thereby enhance light output efficiency.

Figure 3:
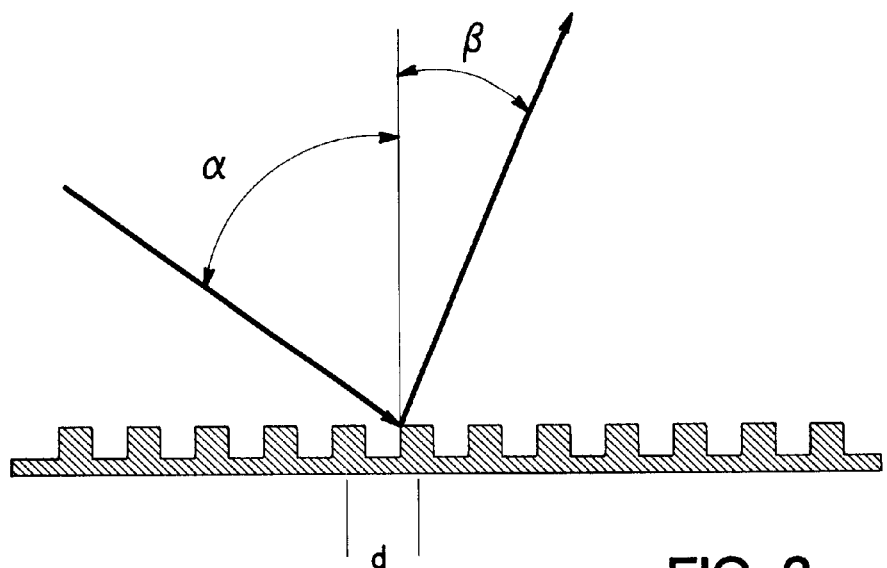
FIG. 3 is a schematic view for explaining the reflection of light on a diffraction grating.

It is known that, when light strikes on a diffraction grating at an incidence angle $\alpha$ as shown in FIG. 3, the relationship among exit angle $\beta$, grating interval d, light wavelength $\lambda$, refractive index n, and order of diffraction k, is expressed by the following equation (A).

$$d(\sin\alpha - \sin\beta) = \frac{k\lambda}{n} \quad (A)$$

Figure 4:
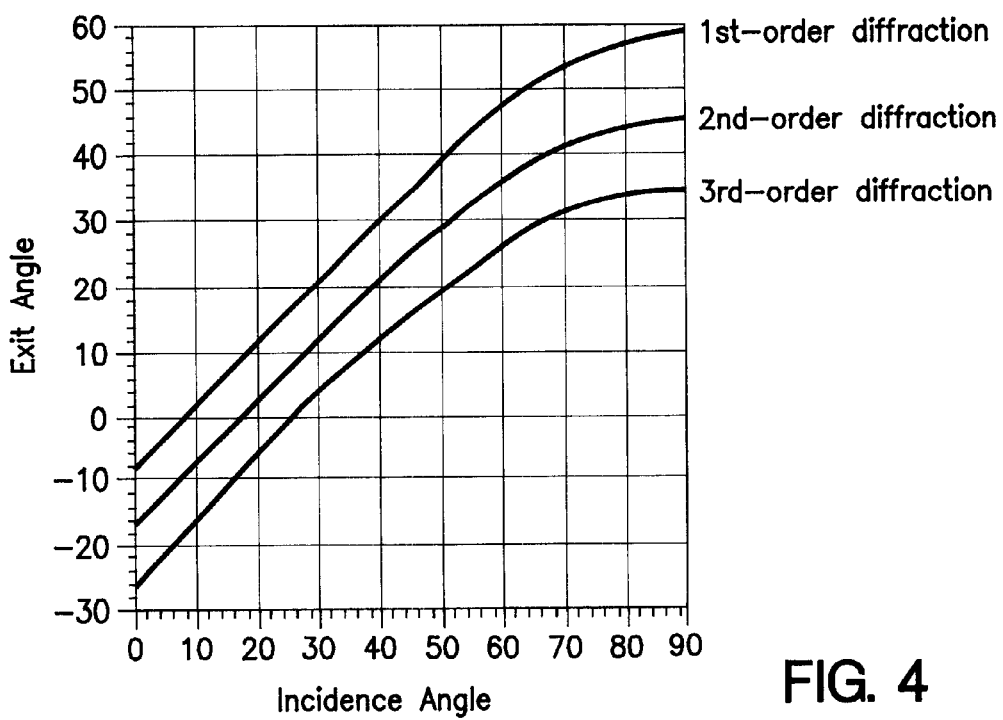
FIG. 4 is a graph for explaining the relationship between incidence angle and exit angle for a diffraction grating having a grating interval of 1 mm, a wavelength of 500 nm, and a refractive index of 1.7.

Accordingly, for light having an incidence angle greater than the critical angle for total reflection, its incidence angle can be reduced to a value smaller than the critical angle by controlling the grating interval properly. For example, on the assumption that an organic material having a refractive index of 1.7 is used, the critical angle for total reflection is 36.0 degrees. The exit angle observed when light having a wavelength of 500 nm is incident on a reflection type diffraction grating having a grating interval of 2 $\mu$m is shown in FIG. 4. It can be seen from this figure that, in order to give an exit angle within 36 degrees, the incidence angle must be less than 46 degrees for first-order diffraction, must be less than 60 degrees for second-order diffraction, and may have any desired value for third-order diffraction.

Figure 1:
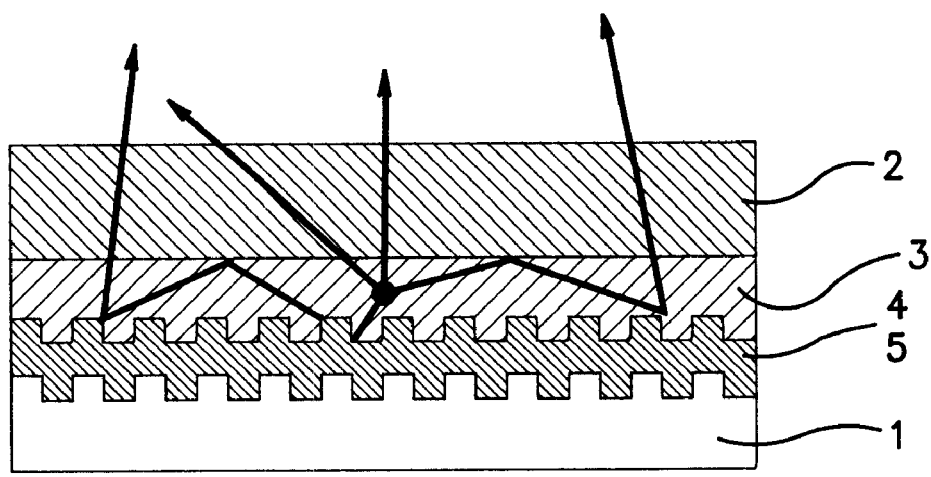
FIG. 1 is a sectional view for explaining the structure of a device having a reflection type diffraction grating according to the present invention.

In the case of a device structure as shown in FIG. 1, i.e., a structure obtained by forming a reflection type diffraction grating 5 on a surface of a substrate 1 so as to serve as a cathode 4, too, and depositing thereon an organic layer 3 and an anode 2 comprising a transparent electrode, the diffraction grating serves as a reflecting surface. Consequently, most of the light having an incidence angle greater than 36 degrees and having undergone total reflection at the interface between the transparent electrode 2 and the ambient medium of the device has an exit angle less than 36 degrees. Thus, this light reaches again the interface between the transparent electrode and the ambient medium of the device, and leaves the device without undergoing total reflection. The component obtained by first-order diffraction and reflected at an exit angle greater than 36 degrees undergoes total reflection at the interface between the transparent electrode and the ambient medium of the device, and strikes again on the diffraction grating. After this process is repeated, almost all of the light is eventually taken out of the device.

Figure 2:
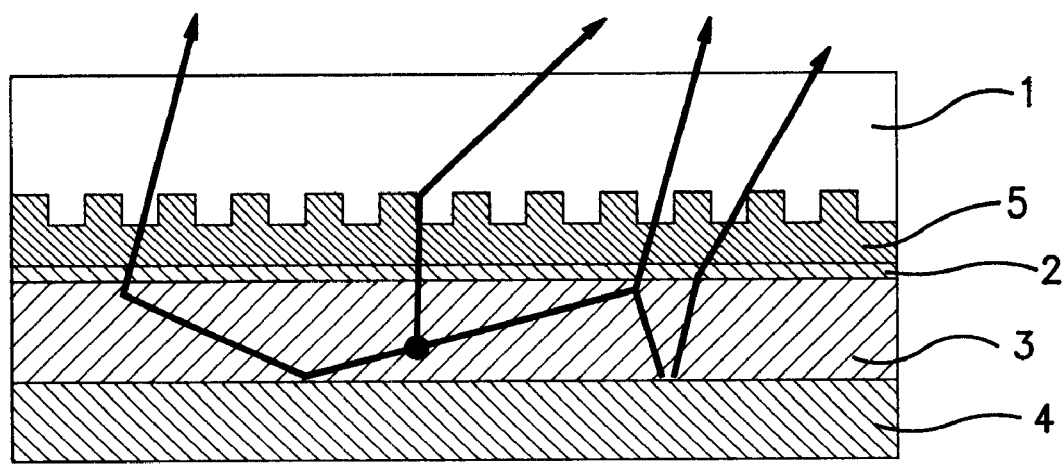
FIG. 2 is a sectional view for explaining the structure of a device having a transmission type diffraction grating according to the present invention.

The reflection type diffraction grating used in this case may have any desired shape, so long as it can function as a diffraction grating. For example, a laminary grating having a rectangular cross section or an echelette grating having a tapered cross section may be formed on the substrate, and the cathode may be deposited thereon so as to serve as a reflecting surface. Alternatively, the cathode may be deposited in the form of alternating stripes by using two cathode materials having different reflection coefficients, or the cathode itself may be formed in a striped pattern to make a diffraction grating.

Where it is desired to use a transmission type diffraction grating, a device may be fabricated by forming a diffraction grating 5 on a substrate 1 and then depositing thereon an anode 2, an organic layer 3 and a cathode 4 in that order, as shown in FIG. 2. In this case, the transmission type diffraction grating may comprise either an amplitude grating or a phase grating, and may have any desired shape. For example, a phase grating may be made by forming grooves in the substrate surface, depositing thereon a layer of a transparent material having a different refractive index, planarizing it, and then depositing an anode, an organic layer and a cathode successively in the usual manner. In the case of an amplitude grating, a material opaque to light may be deposited on the substrate surface in the form of stripes, or the anode itself may be formed in a striped pattern. In the latter case, the anode material may be either transparent or opaque. For example, a device may be fabricated by forming a gold electrode having a striped pattern as the anode, and then depositing thereon an organic layer and a cathode.

When a transmission type diffraction grating is used, the light incident on the diffraction grating is divided into transmitted light and reflected light. However, since the reflected light has a smaller exit angle, it strikes on the diffraction grating again at a smaller incidence angle after being reflected by the cathode. Thus, similarly to a device using a reflection type diffraction grating, almost all of the light can be taken out of the device.

Figure 5:
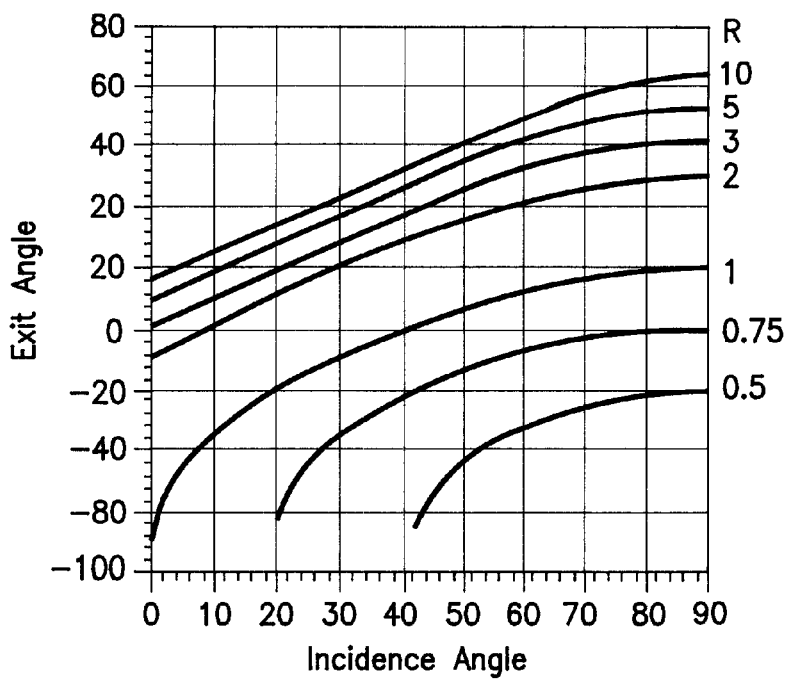
FIG. 5 is a graph showing the dependence of incidence angle and exit angle on the grating interval/optical wavelength ratio for first-order diffraction by a diffraction grating.

The dimensions of the diffraction grating should be determined so that the light output efficiency is enhanced for the desired wavelength region of the electroluminescent device. Specifically, when the wavelength of the electroluminescent device is in the region of visible light (i.e., in the wavelength region of 350 to 800 nm), the effect of the ratio (R) of the grating interval to the optical wavelength for the desired wavelength (i.e., the value obtained by dividing the wavelength by the refractive index) is shown in FIG. 5. Specifically, if the ratio is unduly large, the diffraction grating is less effective in reducing the exit angle, so that reflection at a mirror surface is repeated many times to cause a considerable loss. If the ratio is unduly small, light having a large incidence angle gives reflected light having a large exit angle, so that the proportion of light taken out in the forward direction is decreased. Thus, unduly large and unduly small ratios both reduce the light output efficiency. Accordingly, it is desirable that the ratio is in the range of 0.1 to 10.

Figure 6:
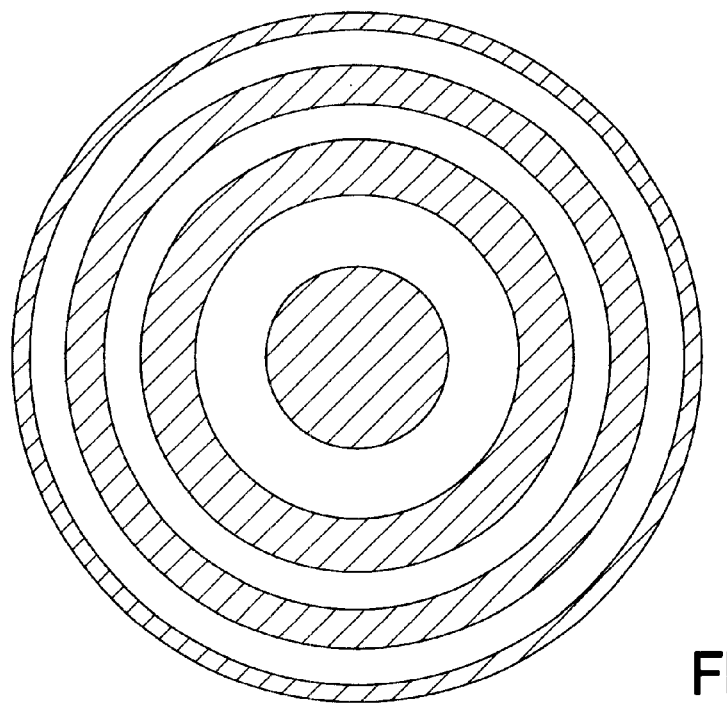
FIG. 6 is a plan view for explaining a zone plate.

In the case of an ordinary diffraction grating, no diffraction effect is produced in a direction parallel to the stripes, so that the light output efficiency in this direction cannot be enhanced. This disadvantage can be overcome by using a two-dimensional diffraction grating. Alternatively, a diffraction grating made by forming grooves in a concentric pattern may also be used. In this case, the intervals of the concentric grooves may be periodic or, as shown in FIG. 6, may be determined according to the interval rule for the formation of a zone plate. Similarly to the above-described diffraction gratings, these diffraction gratings may also be made by forming grooves in the substrate or by forming an electrode itself in a grating pattern. Moreover, the groove may have any desired cross-sectional shape.

Next, the various constituent elements of the device are explained below. With respect to the electrodes of an organic electroluminescent device, the anode functions to inject positive holes into a hole transport layer, and it is effective that the anode has a work function of not less than 4.5 eV. Specific examples of the anode materials which can be used in the present invention include indium-tin oxide alloy (ITO); tin oxide (NESA); metals such as gold, silver, platinum and copper, and their oxides; and mixtures thereof. On the other hand, the cathode serves to inject electrons into an electron transport layer or a luminescent layer, and it is preferable to use a material having a small work function. Although no particular limitation is placed on the type of the cathode material, specific example of usable cathode materials include indium, aluminum, magnesium, magnesium-indium alloy, magnesium-aluminum alloy, aluminum-lithium alloy, aluminum-scandium-lithium alloy, magnesium-silver alloy, and mixtures thereof.

With respect to these electrodes, one of the anode and the cathode is transparent in the region of visible light, and the other has high reflectivity. No particular limitation is placed on the thicknesses of these electrodes, so long as they can perform their proper functions. However, their thicknesses are preferably in the range of 0.02 to 2 $\mu$m.

The organic electroluminescent devices of the present invention have a structure in which one or more organic layers are disposed between the aforesaid electrodes, and no additional restriction is imposed on their structure. Examples thereof are those consisting of (1) an anode, a luminescent layer and a cathode, (2) an anode, a hole transport layer, a luminescent layer, an electron transport layer and a cathode, (3) an anode, a hole transport layer, a luminescent layer and a cathode, and (4) an anode, a luminescent layer, an electron transport layer and a cathode. Moreover, in order to improve charge injection characteristics, suppress dielectric breakdown, or enhance luminous efficiency, a thin-film layer formed of an inorganic dielectric or insulator (e.g., lithium fluoride, magnesium fluoride, silicon oxide, silicon dioxide or silicon nitride), a layer formed of a mixture of an organic material and an electrode material or metal, or a thin film of an organic polymer (e.g., polyaniline, a polyacetylene derivative, a polydiacetylene derivative, a polyvinyl carbazole derivative or a poly(p-phenylene-vinylene) derivative) may be interposed between adjacent organic layers and/or between an organic layer and an electrode.

No particular limitation is placed on the type of the luminescent material used in the present invention, and there may be used any compound that is commonly used as a luminescent material. As given below, examples thereof include tris(8-quinolinol)-aluminum complex (Alq3) [1], bis(diphenylvinyl)biphenyl (BDPVBi) [2], 1,3-bis(p-t-butylphenyl-1,3,4-oxadiazolyl)phenyl (OXD-7) [3], N,N'-bis(2,5-di-t-butylphenyl)perylenetetracarboxylic acid diimide (BPPC) [4] and 1,4-bis(p-tolyl-p-methylstyrylphenylamino)naphthalene [5].

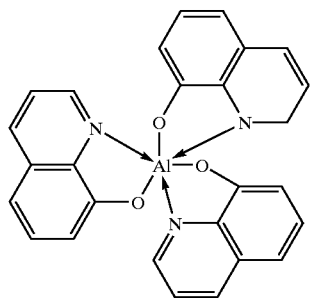

[1]

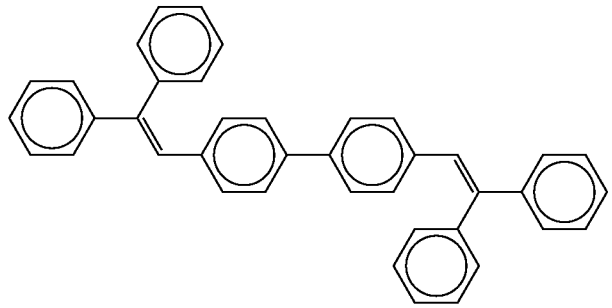

[2]

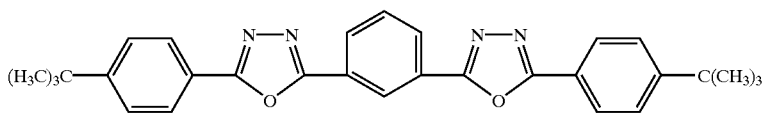

[3]

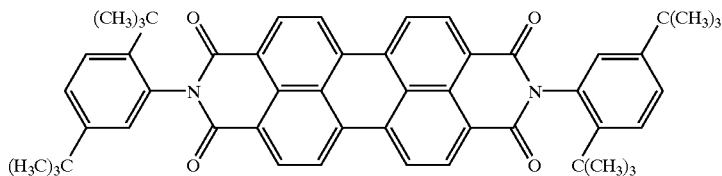

[4]

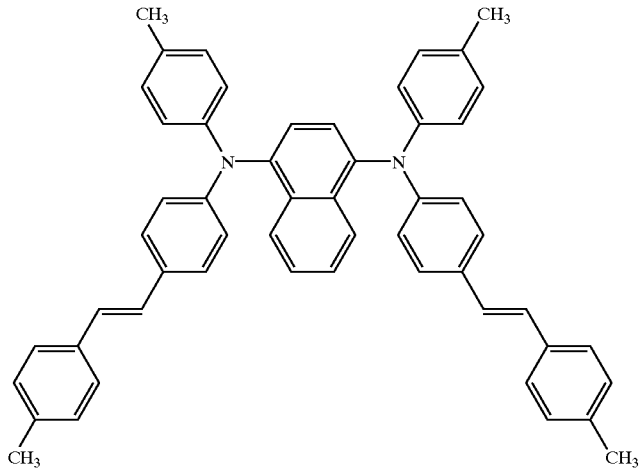

[5]

Alternatively, a layer of a charge transport material doped with a fluorescent material may be used as a luminescent material. Examples thereof include a layer of a quinolinol-metal complex such as the aforesaid Alq3 [1], doped with 4-dicyanomethylene-2-methyl-6-(p-dimethylaminostyryl)-4H-pyran (DCM) [6], a quinacridone derivative such as 2,3-quinacridone [7] or a coumarin derivative such as 3-(2'-benzothiazole)-7-diethylaminocoumarin [8]; a layer of the electron transport material bis(2-methyl-8-hydroxyquinoline)-4-phenylphenol-aluminum complex [9] doped with a fused polycyclic aromatic compound such as perylene [10]; or a layer of the hole transport material 4,4'-bis(m-tolylphenylamino)biphenyl (TPD) [11] doped with rubrene [12].

[6]
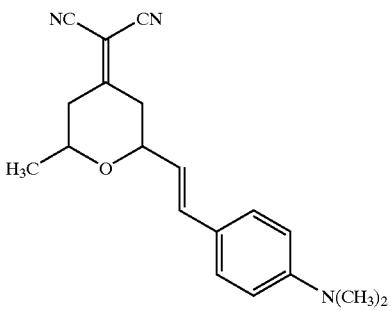

[7]
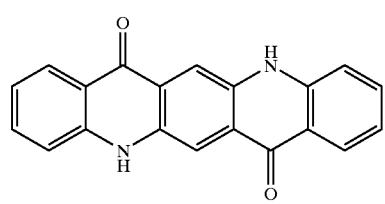

[8]
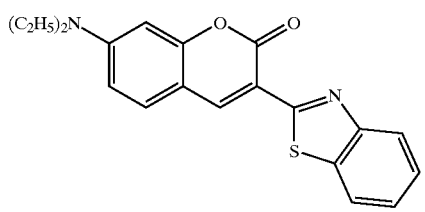

[9]
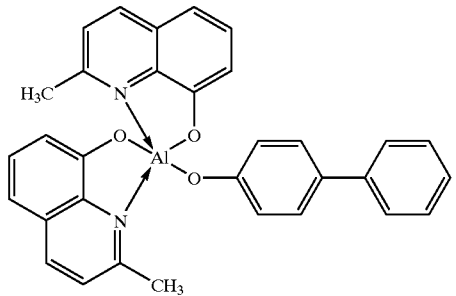

[10]
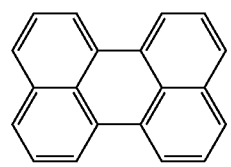

[11]
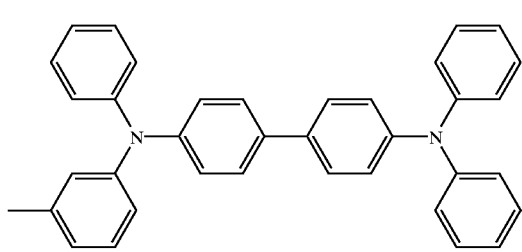

-continued

[12]
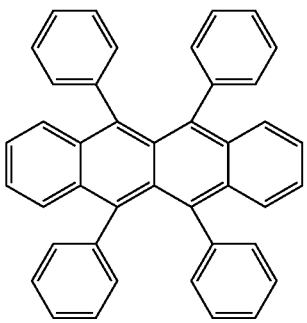

No particular limitation is placed on the type of the hole transport material used in the present invention, and there may be used any compound that is commonly used as a hole transport material. Examples thereof include triphenyl-diamines such as bis[di(p-tolyl)aminophenyl]-1,1-cyclohexane [13], TPD [11] and N,N'-diphenyl-N,N'-bis(1-naphthyl)-1,1'-biphenyl-4,4'-diamine (NPB) [14]; and starburst type molecules (e.g., [15] to [17]).

[13]
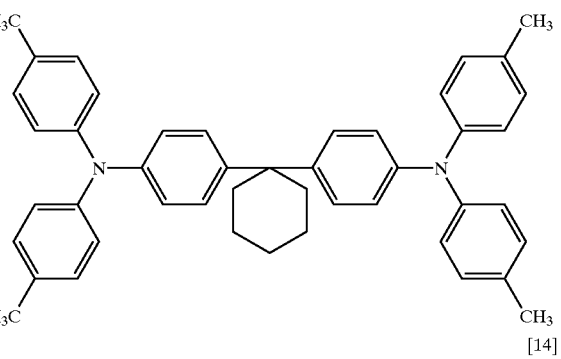

[14]
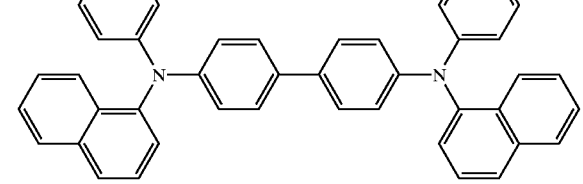

[15]
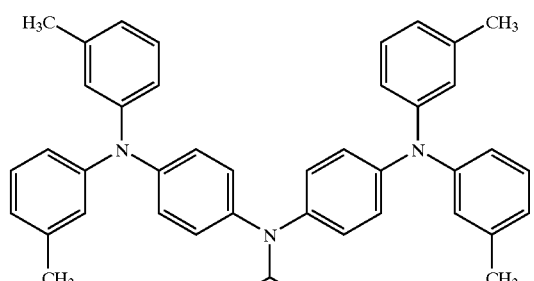

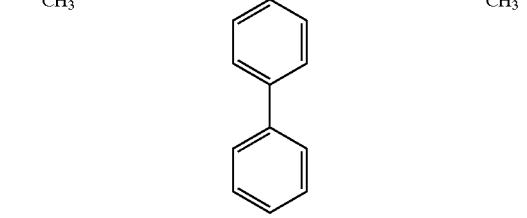

[16]

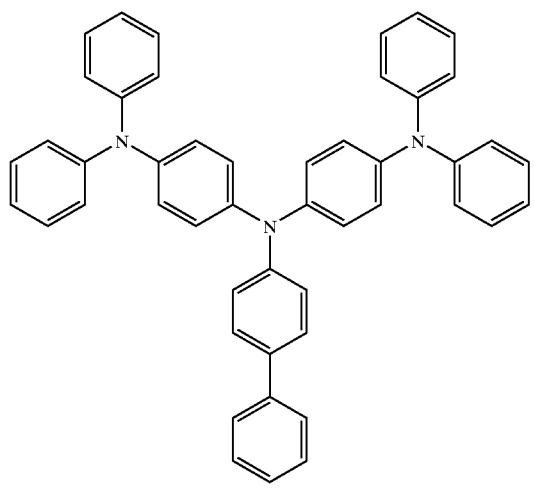

[17]

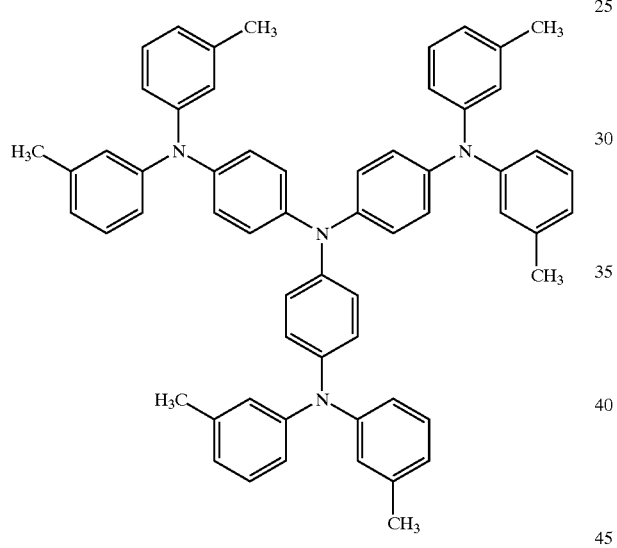

No particular limitation is placed on the type of the electron transport material used in the present invention, and there may be used any compound that is commonly used as an electron transport material. Examples thereof include oxadiazole derivatives such as 2-(4-biphenylyl)-5-(4-t-butylphenyl)-1,3,4-oxadiazole (Bu-PBD) [18] and OXD-7 (3); triazole derivatives (e.g., [19] and [20]); and quinolinol-metal complexes (e.g., [1], [9], and [21] to [24]).

[18]

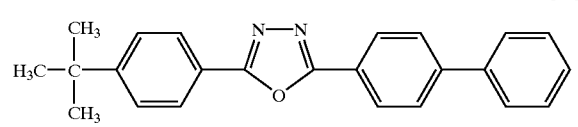

[19]

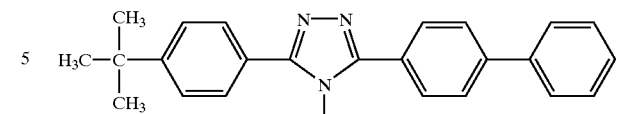

[20]

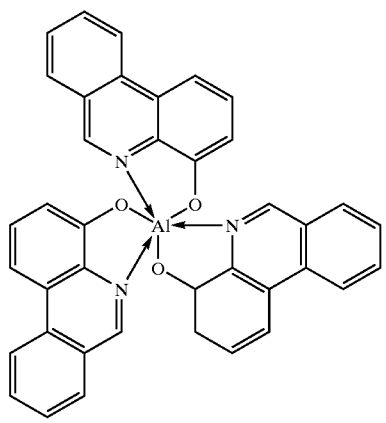

[21]

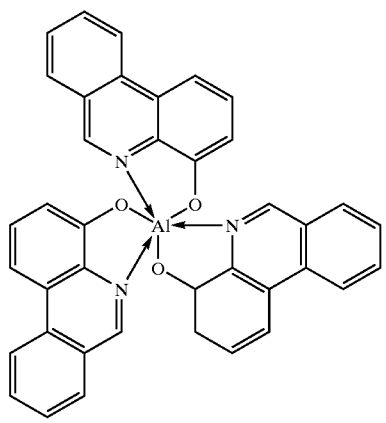

[22]

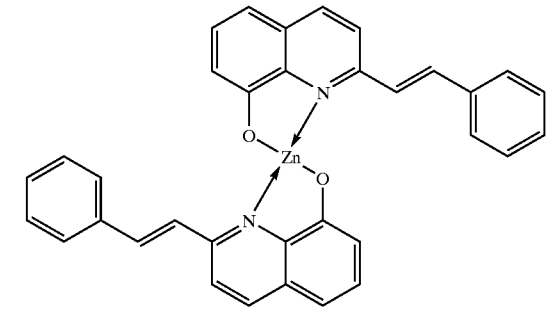

[23]

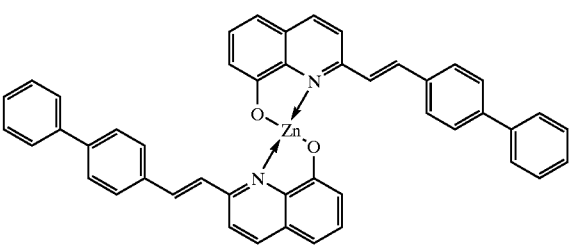

-continued

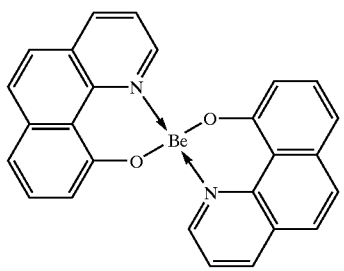

[24]

No particular limitation is placed on the method for forming the various layers constituting the organic electroluminescent device of the present invention. Any conventionally known methods such as vacuum evaporation and spin coating may be employed. The organic thin-film layers each containing a compound as described above, which is used in the organic electroluminescent device of the present invention, can be formed according to any well-known method such as vapor evaporation, molecular beam evaporation (MBE), or coating method such as dipping (in a solution prepared by dissolving the compound in a solvent), spin coating, casting, bar coating or roll coating.

No particular limitation is placed on the thickness of each organic layer used in the organic electroluminescent device of the present invention. However, it is usually preferable that each organic layer have a thickness ranging from several tens of nanometers to 1 micrometer.

EXAMPLES

The present invention is further illustrated by the following examples. However, these examples are not to be construed to limit the scope of the invention.

Comparative Example 1

Figure 8:
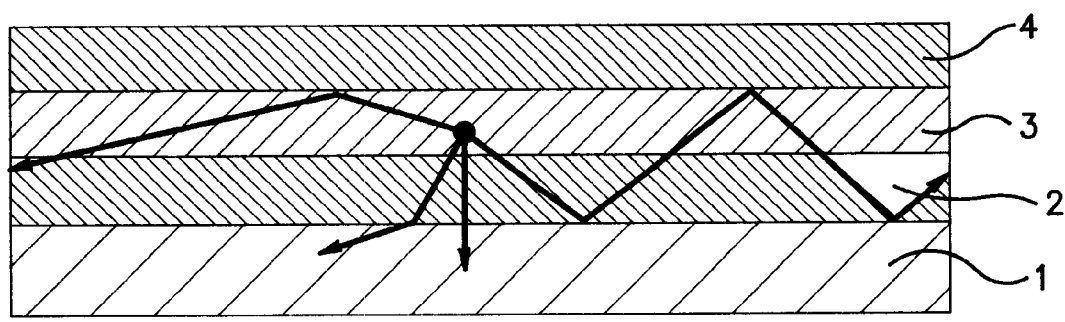
FIG. 8 is a sectional view for explaining a conventional organic electroluminescent device.

The procedure for the fabrication of an organic thin-film electroluminescent device serving as a comparative example is described below. As illustrated in FIG. 8, this device comprises a substrate 1 having thereon an anode 2, an organic layer 3 (composed of a hole injection layer, a luminescent layer and an electron transport layer) and a cathode 4. An ITO layer having a thickness of 100 nm was deposited on a 50 mm×25 mm glass substrate (a thickness of 1.1 mm; NA 45 manufactured by Hoya Corp.) by sputtering. In this step, a metal mask was used to deposit the ITO layer in the form of stripes measuring 2 mm×50 mm. Its sheet resistance was 20 Ω/□.

Then, an organic luminescent layer was deposited by means of a resistance heating type vapor evaporator. While the substrate was mounted in the upper part of a vacuum chamber, a molybdenum boat was placed at a position 250 mm below the substrate. The substrate was arranged so as to give an incidence angle of 38° and rotated at a speed of 30 rotation per minutes. As soon as a pressure of 5 ×10$^{-7}$ Torr was reached, evaporation was started, and the deposition rate was controlled by means of a crystal oscillator type film thickness controller mounted beside the substrate. The deposition rate was preset at 0.15 nm per second. Under the above-described conditions, a hole injection layer comprising compound [15] was deposited to a thickness of 40 nm. Thereafter, a 70 nm thick luminescent layer comprising compound [5] and a 40 nm thick electron transport layer comprising compound [19] were successively evaporated under the same conditions as described above.

Subsequently, a cathode comprising a magnesium-silver alloy was deposited by evaporating magnesium and silver simultaneously from separate boats. Using the aforesaid film thickness controller, the deposition rates of magnesium and silver were adjusted to 1.0 and 0.2 nm per second, respectively, and the film thickness was preset at 200 nm. During this evaporation, a metal mask was used to deposit the cathode in such a way that it consisted of 12 stripes measuring 25 mm×2 mm which were arranged at intervals of 1 mm and in a direction orthogonal to the stripes of ITO. When a voltage of 10 V was applied, this device exhibited a current density of 50 mA/cm$^2$ and a luminance of 1,950 cd/m$^2$. Consequently, its efficiency was 3.9 cd/A or 1.22 lm/W.

Example 1

On a glass substrate similar to that used in Comparative Example 1, a grating pattern having a line width of 1 μm and an interval of 1 μm was formed according to a photolithographic process. Specifically, a 2 μm thick layer of an i-line resist (THMR-iP1700; manufactured by Tokyo Ohka Kogyo Co., Ltd.) was formed on the substrate by spin coating, and patterned by means of an i-line stepper. Then, this substrate was soaked in a hydrofluoric acid solution to form grooves having a depth of 200 nm, and the remaining resist was removed by use of an exclusive stripping fluid. After a cathode comprising a 200 nm thick layer of a magnesium-silver alloy was evaporated thereon under the same conditions as described in Comparative Example 1, organic layers with reverse order of Comparative Example 1 and an ITO layer were successively deposited.

When a voltage of 10 V was applied, this device exhibited a current density of 55 mA/cm$^2$ and a luminance of 3,265 cd/m$^2$. Consequently, its efficiency was 5.94 cd/A or 1.86 lm/W.

Example 2

A device was fabricated in exactly the same manner as in Example 1, except that the grating pattern had a line width of 0.40 μm and an interval of 0.40 μm.

When a voltage of 10 V was applied, this device exhibited a current density of 58 mA/cm$^2$ and a luminance of 4,028 cd/m$^2$. Consequently, its efficiency was 6.94 cd/A or 2.18 lm/W.

Example 3

In order to make a diffraction grating, grooves were formed in a substrate according to the same procedure as described in Example 1. Thereafter, a 500 nm thick layer having a high refractive index was deposited over the grooves according to a sputtering process using titanium oxide as the target, and its surface was planarized by ordinary optical polishing. Subsequently, an ITO layer, an organic layer and a cathode were deposited thereon in exactly the same manner as in Comparative Example 1 to fabricate a device.

When a voltage of 10 V was applied, this device exhibited a current density of 50 mA/cm$^2$ and a luminance of 2,623 cd/m$^2$. Consequently, its efficiency was 5.246 cd/A or 1.647 lm/W.

Example 4

Figure 7:
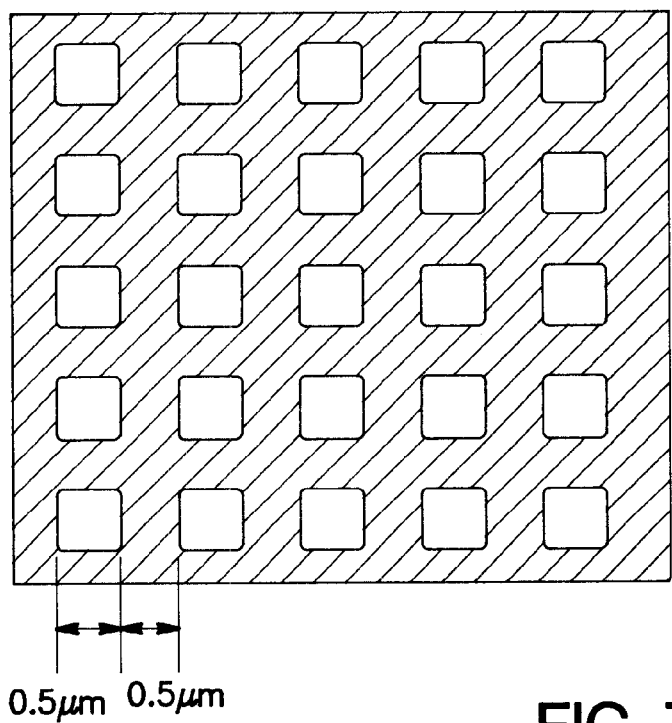
FIG. 7 is a plan view of a two-dimensional grating pattern used in Examples 4 and 5.

A device was fabricated in exactly the same manner as in Example 1, except that the two-dimensional grating pattern shown in FIG. 7 was used. When a voltage of 10 V was applied, this device exhibited a current density of 52 mA/cm² and a luminance of 3,733 cd/m². Consequently, its efficiency was 7.17 cd/A or 2.25 lm/W.

Example 5

A device was fabricated in exactly the same manner as in Example 3, except that the two-dimensional grating pattern shown in FIG. 7 was used. When a voltage of 10 V was applied, this device exhibited a current density of 58 mA/cm² and a luminance of 3,210 cd/m². Consequently, its efficiency was 5.53 cd/A or 1.73 lm/W.

Example 6

The two-dimensional grating pattern shown in FIG. 6 was used. According to Fresnel's method for the formation of annular zones, the widths and intervals of zones were determined on the basis of the radius r from the center as expressed by the following equation (B).

$$r = r_0 \sin\left[\cos^{-1}\left(\frac{nl}{n0}\right)\right] \quad (B)$$

In this equation, 1 is 0.08 μm, $r_0$ is 3 μm, and n is an integer ranging from 1 to 100. Grooves were formed in the zones where n changes from an even number to an odd number. After this zone pattern was formed so as to cover a 5 mm×5 mm area of the substrate surface, the treatment (e.g., planarization) and the formation of several layers were carried out in the same manner as in Example 3.

When a voltage of 10 V was applied, this device exhibited a current density of 50 mA/cm² and a luminance of 3,640 cd/m². Consequently, its efficiency was 7.28 cd/A or 2.28 lm/W.

What is claimed is:

1. An organic electroluminescent device having one or more organic layers including a luminescent layer between an anode and a cathode, wherein said device additionally includes a diffraction grating or zone plate as a constituent element which is formed at a location where the diffraction grating or zone plate suppresses total reflection at an interface of said device.

2. An organic electroluminescent device as claimed in claim 1 wherein the anode and the cathode form the same picture elements, one of these electrodes is an electrode reflecting visible light, and the diffraction grating or zone plate is formed in this reflecting electrode.

3. An organic electroluminescent device as claimed in claim 2 wherein said device has a structure in which the diffraction grating or zone plate, the reflecting electrode, the organic layers and the transparent electrode are formed on a substrate in the order mentioned.

4. An organic electroluminescent device as claimed in claim 1 wherein the anode and the cathode form the same picture elements, one of these electrodes is an electrode reflecting visible light, and the diffraction grating or zone plate is formed in the electrode opposite to the reflecting electrode.

5. An organic electroluminescent device as claimed in claim 4 wherein said device has a structure in which the diffraction grating or zone plate, the transparent electrode, the organic layers and the reflecting electrode are formed on a transparent substrate in the order mentioned.

6. An organic electroluminescent device as claimed in claim 4 wherein the diffraction grating or zone plate has no light-intercepting part.

7. An organic electroluminescent device as claimed in claim 5 wherein the diffraction grating or zone plate has no light-intercepting part.

8. An organic electroluminescent device as claimed in claim 1 wherein the diffraction grating has a two-dimensional periodic configuration.

9. An organic electroluminescent device as claimed in claim 2 wherein the diffraction grating has a two-dimensional periodic configuration.

10. An organic electroluminescent device as claimed in claim 3 wherein the diffraction grating has a two-dimensional periodic configuration.

11. An organic electroluminescent device as claimed in claim 4 wherein the diffraction grating has a two-dimensional periodic configuration.

12. An organic electroluminescent device as claimed in claim 5 wherein the diffraction grating has a two-dimensional periodic configuration.

13. An organic electroluminescent device as claimed in claim 6 wherein the diffraction grating has a two-dimensional periodic configuration.

14. An organic electroluminescent device as claimed in claim 7 wherein the diffraction grating has a two-dimensional periodic configuration.

15. An organic electroluminescent device as claimed in claim 4 wherein the diffraction grating or zone plate has no additional light-intercepting part.

16. An organic electroluminescent device as claimed in claim 5 wherein the diffraction grating or zone plate has no additional light-intercepting part.

* * * * *